United States Patent [19]

Lee

[11] Patent Number: 5,881,018
[45] Date of Patent: Mar. 9, 1999

[54] DEVICE AND METHOD FOR AUTOMATICALLY SETTING STATUS OF DYNAMIC RANDOM ACCESS MEMORY THROUGH CONTROL OF CLOCK ENABLE SIGNAL

[75] Inventor: Myong Don Lee, Ichon, Rep. of Korea

[73] Assignee: Hyundai Electronics Industries Co., Ltd., Rep. of Korea

[21] Appl. No.: 980,454

[22] Filed: Nov. 28, 1997

[30] Foreign Application Priority Data

Dec. 31, 1996 [KR] Rep. of Korea ............... 96-80254

[51] Int. Cl.⁶ ............................................. G11C 7/00
[52] U.S. Cl. .............................. 365/233; 365/189.01
[58] Field of Search ........................ 365/233, 189.01, 365/191, 189.05

[56] References Cited

U.S. PATENT DOCUMENTS

| | | | |
|---|---|---|---|
| 4,939,470 | 7/1990 | Kang | 328/14 |
| 5,483,496 | 1/1996 | Murakawa | 365/233 |
| 5,495,451 | 2/1996 | Cho | 365/221 |
| 5,577,005 | 11/1996 | Bae | 365/233 |

Primary Examiner—Vu. A. Le
Attorney, Agent, or Firm—Gary M. Nath; Harold L. Novick; Nath & Associates

[57] ABSTRACT

A device and a method for automatically setting a status of a dynamic random access memory through the control of a clock enable signal. The device comprises a frequency amplification circuit for amplifying a main clock signal by a desired number of times in response to a frequency amplification enable signal and outputting the amplified signal as an internal clock signal, a clock enable detection/control circuit for detecting the clock enable signal, combining the detected clock enable signal with the internal clock signal from the frequency amplification circuit to generate the frequency amplification enable signal, a memory status setting signal and a clock enable latch signal and outputting the frequency amplification enable signal to the frequency amplification circuit, and a status setting signal output circuit for generating a plurality of command signals in response to the memory status setting signal and clock enable latch signal from the clock enable detection/control circuit and outputting the generated command signals to the dynamic random access memory. According to the present invention, a mode of the memory can automatically be changed through the control of only the clock enable signal. This is convenient to the user.

12 Claims, 4 Drawing Sheets

DEVICE AND METHOD FOR AUTOMATICALLY SETTING STATUS OF DYNAMIC RANDOM ACCESS MEMORY THROUGH CONTROL OF CLOCK ENABLE SIGNAL

BACKGROUND OF THE INVENTION

1. Field of the Invention

The present invention relates in general to automatically setting a status of a dynamic random access memory (referred to hereinafter as DRAM), and more particularly to a device and a method for automatically setting a status of a DRAM through the control of a clock enable signal, in which the clock enable signal is controlled and analyzed to automatically set a mode of the DRAM.

2. Description of the Prior Art

Generally, in order to control the operations of an SDRAM and a DRAM, a main processing unit MPU processes control signals such as a chip select signal /CS, a row address strobe signal /RAS, a column address strobe signal /CAS, a write enable signal /WE and a clock enable signal CKE.

For example, an operation mode of the DRAM is changed according to a state of the clock enable signal. The clock enable signal remains at its high logic state while a normal operation is performed, and then goes low in logic when a mode change operation is performed.

However, the mode change operation is not performed only by changing the state of the clock enable signal but by combining it with the other signals.

Usually, in the case where the clock enable signal becomes low in logic, the current operation mode is changed to a power down mode in which a self-refresh operation may be performed.

Another mode operable by the low logic state of the clock enable signal is a clock suspend mode. However, the clock suspend mode can be performed by combining the clock enable signal of low logic with the row and column address strobe signals.

For this reason, set levels of pins for inputting the above-mentioned signals must be known thoroughly. Further, the levels of the signal input pins must be changed whenever a function is changed. These are inconvenient to the user.

SUMMARY OF THE INVENTION

Therefore, the present invention has been made in view of the above problem, and it is an object of the present invention to provide a device and a method for automatically setting a status of a DRAM through the control of a clock enable signal, in which the clock enable signal is controlled and analyzed to automatically control levels of other signals in the DRAM.

In accordance with one aspect of the present invention, there is provided a device for automatically setting a status of a dynamic random access memory through the control of a clock enable signal, comprising frequency amplification means for amplifying a main clock signal by a desired number of times in response to a frequency amplification enable signal and outputting the amplified signal as an internal clock signal; clock enable detection/control means for detecting the clock enable signal, combining the detected clock enable signal with the internal clock signal from the frequency amplification means to generate the frequency amplification enable signal, a memory status setting signal and a clock enable latch signal and outputting the frequency amplification enable signal to the frequency amplification means; and status setting signal output means for generating a plurality of command signals in response to the memory status setting signal and clock enable latch signal from the clock enable detection/control means and outputting the generated command signals to the dynamic random access memory.

In accordance with another aspect of the present invention, there is provided a method for automatically setting a status of a dynamic random access memory through the control of a clock enable signal, comprising the first step of prescribing modes of the dynamic random access memory on the basis of the number of successive low logic states of the clock enable signal; the second step of controlling the clock enable signal so that it can have successive low logic states of the number corresponding to a desired one of the modes of the dynamic random access memory; the third step of counting the number of successive low logic states of the clock enable signal controlled at the second step; and the fourth step of generating a plurality of command signals necessary to cell selection according to the counted value.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
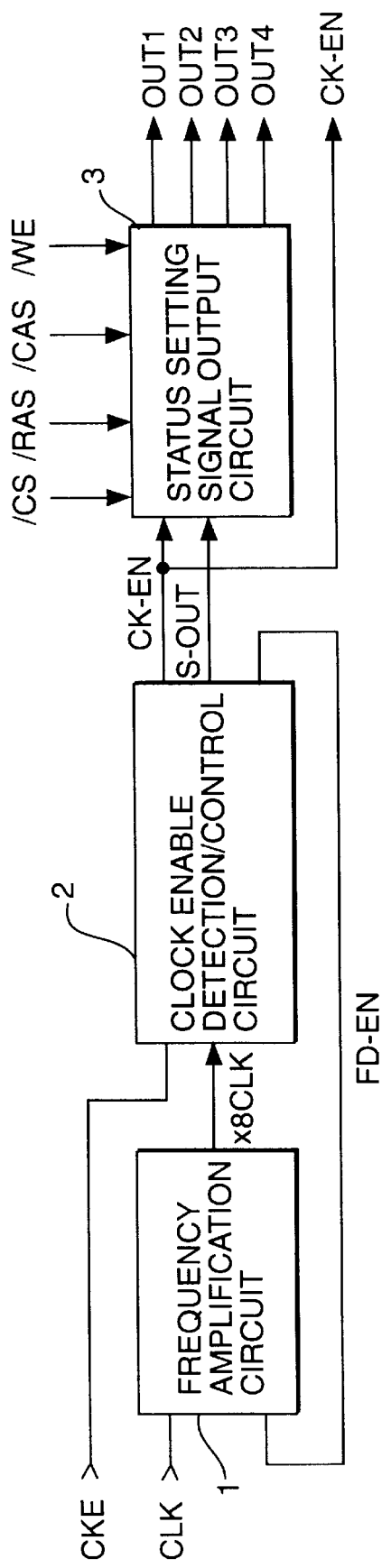
FIG. 1 is a schematic block diagram of a device for automatically setting a status of a DRAM in accordance with the present invention.

FIG. 1 is a schematic block diagram of a device for automatically setting a status of a DRAM in accordance with the present invention. As shown in this drawing, the automatic DRAM status setting device comprises a frequency amplification circuit 1 for amplifying a main clock signal CLK by eight times in response to a frequency amplification enable signal FD-EN and outputting the amplified signal as an internal clock signal x8CLK, a clock enable detection/control circuit 2 for detecting a clock enable signal CKE, combining the detected clock enable signal CKE with the internal clock signal x8CLK from the frequency amplification circuit 1 to generate the frequency amplification enable signal FD-EN, a DRAM status setting signal S-OUT and a clock enable latch signal CK-EN and outputting the generated frequency amplification enable signal FD-EN to the frequency amplification circuit 1, and a status setting signal output circuit 3 for generating a plurality of command signals in response to the DRAM status setting signal S-OUT and clock enable latch signal CK-EN from the clock enable detection/control circuit 2 and outputting the generated command signals to the DRAM.

Figure 2:
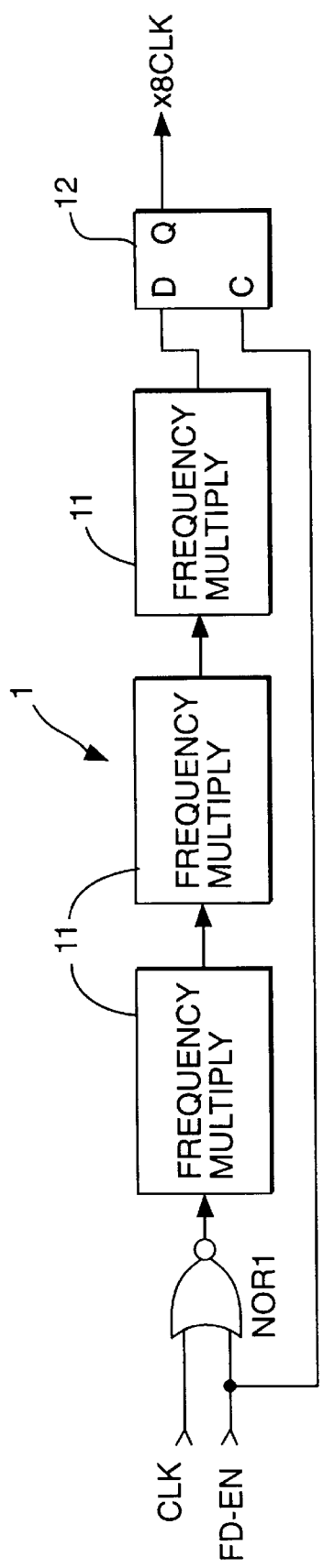
FIG. 2 is a detailed block diagram of a frequency amplification circuit in FIG. 1.

FIG. 2 is a detailed block diagram of the frequency amplification circuit 1 in FIG. 1. As shown in this drawing, the frequency amplification circuit 1 includes a NOR gate NOR1 for NORing the main clock signal CLK and the frequency amplification enable signal FD-EN from the clock enable detection/control circuit 2, a plurality of frequency multipliers 11 connected in series to an output terminal of the NOR gate NOR1, for multiplying a frequency of an output signal from the NOR gate NOR1 by eight, and a latch 12 for latching an output signal from the last one of the frequency multipliers 11 in response to the frequency amplification enable signal FD-EN from the clock enable detection/control circuit 2 and outputting the latched signal as the internal clock signal x8CLK to the clock enable detection/control circuit 2.

The frequency amplification enable signal FD-EN from the clock enable detection/control circuit 2 is a high active signal. As a result, the latch 12 is adapted to output the internal clock signal x8CLK only when the frequency amplification enable signal FD-EN from the clock enable detection/control circuit 2 is high in logic.

Figure 3:
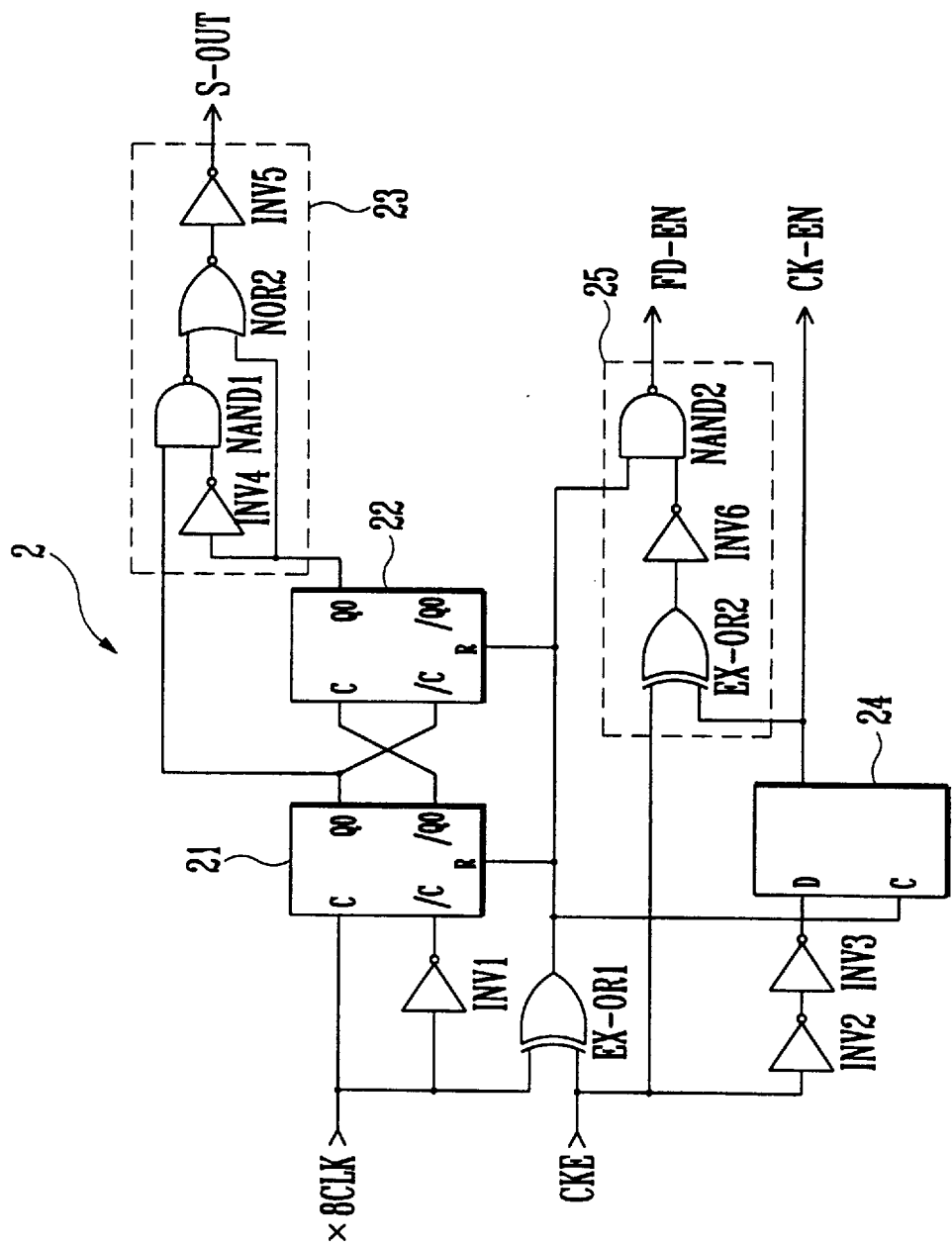
FIG. 3 is a detailed circuit diagram of a clock enable detection/control circuit in FIG. 1.

FIG. 3 is a detailed circuit diagram of the clock enable detection/control circuit 2 in FIG. 1. As shown in this drawing, the clock enable detection/control circuit 2 includes an inverter INV1 for inverting the internal clock signal x8CLK from the frequency amplification circuit 1, a first flip-flop 21 for receiving the internal clock signal x8CLK from the frequency amplification circuit 1 at its one input terminal and an output signal from the inverter INV1 at its other input terminal to provide its first and second output signals Q0 and /Q0, a second flip-flop 22 for receiving the second output signal /Q0 from the first flip-flop 21 at its one input terminal and the first output signal Q0 from the first flip-flop 21 at its other input terminal to provide its first and second output signals Q1 and /Q1, and a DRAM status setting signal output unit 23 for logically combining the first output signal Q0 from the first flip-flop 21 and the first output signal Q1 from the second flip-flop 22 and outputting the logically combined result as the DRAM status setting signal S-OUT to the status setting signal output circuit 3.

The clock enable detection/control circuit 2 further includes an exclusive-OR gate EX-OR1 for exclusive-ORing the internal clock signal x8CLK from the frequency amplification circuit 1 and the clock enable signal CKE and outputting the exclusive-ORed result to reset terminals of the first and second flip-flops 21 and 22, a plurality of inverters INV2 and INV3 for delaying the clock enable signal CKE for a predetermined time period, a latch 24 for latching an output signal from the inverter INV3 in response to an output signal from the exclusive-OR gate EX-OR1 and outputting the latched signal as the clock enable latch signal CK-EN to the status setting signal output circuit 3, and a frequency amplification enable signal output unit 25 for logically combining the clock enable signal CKE, the output signal from the exclusive-OR gate EX-OR1 and the clock enable latch signal CK-EN from the latch 24 and outputting the logically combined result as the frequency amplification enable signal FD-EN to the frequency amplification circuit 1.

The first and second flip-flops 21 and 22 are adapted to count the internal clock signal x8CLK from the frequency amplification circuit 1 when the output signal from the exclusive-OR gate EX-OR1 is low in logic. Preferably, the first and second flip-flops 21 and 22 may be RS flip-flops.

The DRAM status setting signal output unit 23 includes an inverter INV4 for inverting the first output signal Q1 from the second flip-flop 22, a NAND gate NAND1 for NANDing the first output signal Q0 from the first flip-flop 21 and an output signal from the inverter INV4, a NOR gate NOR2 for NORing an output signal from the NAND gate NAND1 and the first output signal Q1 from the second flip-flop 22, and an inverter INV5 for inverting an output signal from the NOR gate NOR2 and outputting the inverted signal as the DRAM status setting signal S-OUT to the status setting signal output circuit 3.

The frequency amplification enable signal output unit 25 includes an exclusive-OR gate EX-OR2 for exclusive-ORing the clock enable signal CKE and the clock enable latch signal CK-EN from the latch 24, an inverter INV6 for inverting an output signal from the exclusive-OR gate EX-OR2, and a NAND gate NAND2 for NANDing the output signal from the exclusive-OR gate EX-OR1 and an output signal from the inverter INV6 and outputting the NANDed result as the frequency amplification enable signal FD-EN to the frequency amplification circuit 1.

Figure 4:
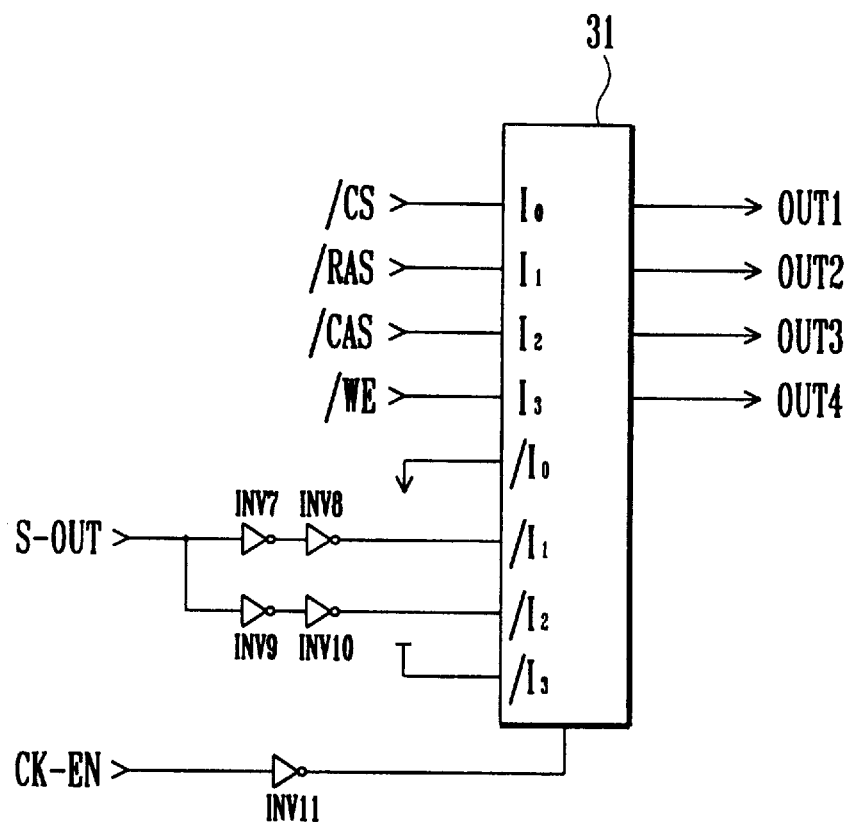
FIG. 4 is a detailed circuit diagram of a status setting signal output circuit in FIG. 1.

FIG. 4 is a detailed circuit diagram of the status setting signal output circuit 3 in FIG. 1. As shown in this drawing, the status setting signal output circuit 3 includes a plurality of inverters INV7 and INV8 for delaying the DRAM status setting signal S-OUT from the clock enable detection/control circuit 2 for a first predetermined time period, a plurality of inverters INV9 and INV10 for delaying the DRAM status setting signal S-OUT from the clock enable detection/control circuit 2 for a second predetermined time period, an inverter INV11 for inverting the clock enable latch signal CK-EN from the clock enable detection/control circuit 2, and a multiplexer 31 for outputting a plurality of external command signals /CS, /RAS, /CAS and /WE or a plurality of internal command signals /ICS, /IRAS, /ICAS and /IWE respectively at its output terminals OUT1–OUT4 in response to an output signal from the inverter INV11.

When the clock enable latch signal CK-EN from the clock enable detection/control circuit 2 is high in logic, the multiplexer 31 outputs the external command signals /CS, /RAS, /CAS and /WE respectively at its output terminals OUT1–OUT4. To the contrary, when the clock enable latch signal CK-EN from the clock enable detection/control circuit 2 is low in logic, the multiplexer 31 outputs the internal command signals /ICS, /IRAS, /ICAS and /IWE respectively at its output terminals OUT1–OUT4.

For reference, the functions of the above-mentioned signals will hereinafter be described.

1) CLOCK SIGNAL CLK: a system main clock signal.

2) CLOCK ENABLE SIGNAL CKE: an external signal which is supplied from a main processing unit or the outside of the DRAM to set the status of the DRAM. In the present invention, the mode of the DRAM can be changed according to the number of low logic states of the clock enable signal CKE.

Namely, the current mode of the DRAM can automatically be set to three modes, or a power down mode, a self-refresh mode and a clock suspend mode, according to the number of low logic states of the clock enable signal CKE.

It is prescribed here that the current mode of the DRAM is the clock suspend mode when the clock enable signal CKE has three successive low logic states, the power down mode when it has two successive low logic states and the self-refresh mode when it has one low logic state.

Such a prescription can readily be modified by changing a control program according to the DRAM type, main processing unit and utilization environments. Further, there may be no necessity for separately prescribing the self-refresh mode because it is automatically performed in the power down mode.

3) INTERNAL CLOCK SIGNAL x8CLK: a clock signal which is obtained by multiplying a frequency of the main clock signal CLK by eight. The internal clock signal x8CLK is used as a clock signal to the first and second flip-flops 21 and 22 for the internal status determination. Also, the internal clock signal x8CLK is synchronized with the clock enable signal CKE.

Further, the internal clock signal x8CLK is exclusive-ORed with the clock enable signal CKE to produce a reset signal. The internal clock signal x8CLK is also used for the production of the frequency amplification enable signal FD-EN and clock enable latch signal CK-EN.

4) RESET SIGNAL R: a control signal which controls the operations of the first and second flip-flops 21 and 22. The first and second flip-flops 21 and 22 are operated when the reset signal R is low in logic.

Further, the frequency amplification enable signal FD-EN is enabled when the reset signal R is low in logic and disabled when the reset signal R is high in logic.

5) OUTPUT SIGNALS Q0 and Q1: output signals from the first and second flip-flops 21 and 22 which are obtained by counting the number of low logic states of the internal clock signals x8CLK corresponding to the number of low logic states of the clock enable signal CKE.

6) DRAM STATUS SETTING SIGNAL S-OUT: a DRAM status setting signal which is obtained by combining the output signals Q0 and Q1 from the first and second flip-flops 21 and 22.

7) CLOCK ENABLE LATCH SIGNAL CK-EN: a signal which is obtained by exclusive-ORing the clock enable signal CKE and the internal clock signal x8CLK. The clock enable latch signal CK-EN is used for the output selection of the multiplexer 31.

The multiplexer 31 outputs the external command signals /CS, /RAS, /CAS and /WE when the clock enable latch signal CK-EN is high in logic and the internal command signals /ICS, /IRAS, /ICAS and /IWE when the clock enable latch signal CK-EN is low in logic.

8) FREQUENCY AMPLIFICATION ENABLE SIGNAL FD-EN: a signal which is obtained by combining the reset signal R, the clock enable signal CKE and the clock enable latch signal CK-EN. The frequency amplification circuit 1 is operated when the frequency amplification enable signal FD-EN is high in logic and not operated when the frequency amplification enable signal FD-EN is low in logic.

Now, the operation of the automatic DRAM status setting device with the above-mentioned construction in accordance with the present invention will be described in detail with reference to FIGS. 5a to 5m.

Figure 5:
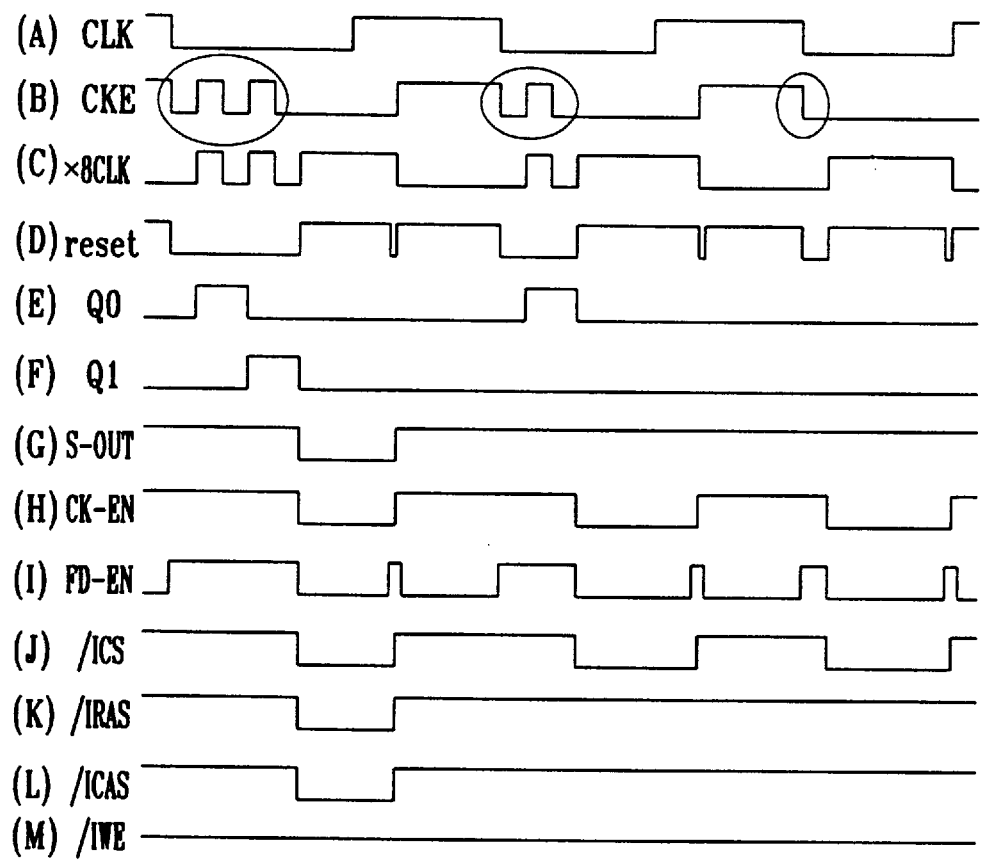
FIG. 5 is timing diagrams illustrating the operation of the automatic DRAM status setting device in accordance with the present invention.

FIGS. 5a to 5m are timing diagrams illustrating the operation of the automatic DRAM status setting device in accordance with the present invention. First, in the frequency amplification circuit 1, the main clock signal as shown in FIG. 5a is NORed with the frequency amplification enable signal FD-EN as shown in FIG. 5i by the NOR gate NOR1 and then multiplied in frequency by eight by the frequency multipliers 11. As a result of the frequency multiplication, the internal clock signal x8CLK is generated as shown in FIG. 5c and then applied to the clock enable detection/control circuit 2.

In the clock enable detection/control circuit 2, the first and second flip-flops 21 and 22 count the internal clock signal x8CLK and provide the counted results to the DRAM status setting signal output unit 23. The DRAM status setting signal output unit 23 logically combines the output signals Q0 and Q1 from the first and second flip-flops 21 and 22 to generate the DRAM status setting signal S-OUT as shown in FIG. 5g.

As shown in FIGS. 5e and 5i, the first flip-flop 21 provides its output signal Q0 when the frequency amplification enable signal FD-EN is high in logic.

The internal clock signal x8CLK is also exclusive-ORed with the clock enable signal CKE as shown in FIG. 5b by the exclusive-OR gate EX-OR1 and then applied to the reset terminals of the first and second flip-flops 21 and 22. As a result, when the output signal from the exclusive-OR gate EX-OR1 is low in logic, the first and second flip-flops 21 and 22 count the number of low logic states of the internal clock signal x8CLK.

In the case where the internal clock signal x8CLK has three successive low logic states as shown in FIG. 5c, the output signals Q0 and Q1 from the first and second flip-flops 21 and 22 become successively high in logic as shown in FIGS. 5e and 5f.

When the output signals Q0 and Q1 from the first and second flip-flops 21 and 22 become successively high in logic, the DRAM status setting signal S-OUT from the DRAM status setting signal output unit 23 goes from high to low in logic so that the current mode of the DRAM can be recognized as the clock suspend mode.

Also, the clock enable latch signal CK-EN from the latch 24 becomes low in logic as shown in FIG. 5h, thereby causing the multiplexer 31 in the status setting signal output circuit 3 to output the internal command signals /ICS, /IRAS, /ICAS and /IWE to a cell array.

At this time, because the current mode of the DRAM is the clock suspend mode, the multiplexer 31 outputs "0001".

In this manner, the DRAM status is automatically set. The above-mentioned operation is performed similarly with respect to the other modes.

As seen from FIG. 5c, the clock enable signal CKE has three low logic states at the first period, two low logic states at the second period and one low logic state at the third period. Also, as seen from FIGS. 5e–5g, when the output signals Q0 and Q1 from the first and second flip-flops 21 and 22 become successively high in logic, the DRAM status setting signal S-OUT from the DRAM status setting signal output unit 23 goes from high to low in logic to indicate the clock suspend mode.

The DRAM status setting signal S-OUT from the DRAM status setting signal output unit 23 remains at its high logic state in the other modes.

In result, the multiplexer 31 outputs the external command signals /CS, /RAS, /CAS and /WE or the internal command signals /ICS, /IRAS, /ICAS and /IWE in response to the clock enable latch signal CK-EN as shown in FIG. 5h, received at its select terminal SEL. The internal command signals /ICS, /IRAS, /ICAS are "0001" in the clock suspend mode and "0111" in the other modes. The values of the internal command signals may be changed according to a user's selection.

As apparent from the above description, according to the present invention, the DRAM mode can automatically be changed through the control of only the clock enable signal. This is convenient to the user.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A device for automatically setting a status of a dynamic random access memory through the control of a clock enable signal, comprising:

frequency amplification means for amplifying a main clock signal by a desired number of times in response to a frequency amplification enable signal and outputting the amplified signal as an internal clock signal;

clock enable detection/control means for detecting said clock enable signal, combining the detected clock enable signal with said internal clock signal from said frequency amplification means to generate said frequency amplification enable signal, a memory status setting signal and a clock enable latch signal and outputting said frequency amplification enable signal to said frequency amplification means; and status setting signal output means for generating a plurality of command signals in response to said memory status setting signal and clock enable latch signal from said clock enable detection/control means and outputting the generated command signals to said dynamic random access memory.

2. A device for automatically setting a status of a dynamic random access memory through the control of a clock enable signal, as set forth in claim 1, wherein said frequency amplification means includes:

a NOR gate for NORing said main clock signal and said frequency amplification enable signal from said clock enable detection/control means;

a plurality of frequency multipliers connected in series to an output terminal of said NOR gate, for multiplying a frequency of an output signal from said NOR gate by said desired number; and a latch for latching an output signal from the last one of said frequency multipliers and outputting the latched signal as said internal clock signal to said clock enable detection/control means.

3. A device for automatically setting a status of a dynamic random access memory through the control of a clock enable signal, as set forth in claim 2, wherein said latch is adapted to output said internal clock signal in response to said frequency amplification enable signal from said clock enable detection/control means.

4. A device for automatically setting a status of a dynamic random access memory through the control of a clock enable signal, as set forth in claim 1, wherein modes of said dynamic random access memory are prescribed on the basis of the number of successive low logic states of said clock enable signal.

5. A device for automatically setting a status of a dynamic random access memory through the control of a clock enable signal, as set forth in claim 1, wherein said clock enable detection/control means includes:

a first inverter for inverting said internal clock signal from said frequency amplification means;

a first flip-flop for receiving said internal clock signal from said frequency amplification means at its one input terminal and an output signal from said first inverter at its other input terminal to provide its first and second output signals;

a second flip-flop for receiving said second output signal from said first flip-flop at its one input terminal and said first output signal from said first flip-flop at its other input terminal to provide its first and second output signals;

a memory status setting signal output unit for logically combining said first output signal from said first flip-flop and said first output signal from said second flip-flop and outputting the logically combined result as said memory status setting signal to said status setting signal output means;

a first exclusive-OR gate for exclusive-ORing said internal clock signal from said frequency amplification means and said clock enable signal and outputting the exclusive-ORed result to reset terminals of said first and second flip-flops;

a plurality of second inverters for delaying said clock enable signal for a predetermined time period;

a latch for latching an output signal from the last one of said second inverters in response to an output signal from said first exclusive-OR gate and outputting the latched signal as said clock enable latch signal to said status setting signal output means; and a frequency amplification enable signal output unit for logically combining said clock enable signal, said output signal from said first exclusive-OR gate and said clock enable latch signal from said latch and outputting the logically combined result as said frequency amplification enable signal to said frequency amplification means.

6. A device for automatically setting a status of a dynamic random access memory through the control of a clock enable signal, as set forth in claim 5, wherein said memory status setting signal output unit includes:

a third inverter for inverting said first output signal from said second flip-flop;

a NAND gate for NANDing said first output signal from said first flip-flop and an output signal from said third inverter;

a NOR gate for NORing an output signal from said NAND gate and said first output signal from said second flip-flop; and a fourth inverter for inverting an output signal from said NOR gate and outputting the inverted signal as said memory status setting signal to said status setting signal output means.

7. A device for automatically setting a status of a dynamic random access memory through the control of a clock enable signal, as set forth in claim 5, wherein said frequency amplification enable signal output unit includes:

a second exclusive-OR gate for exclusive-ORing said clock enable signal and said clock enable latch signal from said latch;

a third inverter for inverting an output signal from said second exclusive-OR gate; and a NAND gate for NANDing said output signal from said first exclusive-OR gate and an output signal from said third inverter and outputting the NANDed result as said frequency amplification enable signal to said frequency amplification means.

8. A device for automatically setting a status of a dynamic random access memory through the control of a clock enable signal, as set forth in claim 1, wherein said status setting signal output means includes:

a plurality of first inverters for delaying said memory status setting signal from said clock enable detection/control means for a first predetermined time period;

a plurality of second inverters for delaying said memory status setting signal from said clock enable detection/control means for a second predetermined time period;

a third inverter for inverting said clock enable latch signal from said clock enable detection/control means; and a multiplexer for outputting a plurality of external command signals or a plurality of internal command signals in response to an output signal from said third inverter.

9. A device for automatically setting a status of a dynamic random access memory through the control of a clock enable signal, as set forth in claim 8, wherein said multiplexer is adapted to output said external command signals when said clock enable latch signal from said clock enable detection/control means is high in logic and said internal command signals when said clock enable latch signal from said clock enable detection/control means is low in logic.

10. A method for automatically setting a status of a dynamic random access memory through the control of a clock enable signal, comprising the steps of:

(a) prescribing modes of said dynamic random access memory on the basis of the number of successive low logic states of said clock enable signal;

(b) controlling said clock enable signal so that it can have successive low logic states of the number corresponding to a desired one of said modes of said dynamic random access memory;

(c) counting the number of successive low logic states of said clock enable signal controlled at said step (b); and (d) generating a plurality of command signals necessary to cell selection according to the counted value.

11. A method for automatically setting a status of a dynamic random access memory through the control of a clock enable signal, as set forth in claim 10, wherein said step (a) includes the step of prescribing a clock suspend mode when the number of successive low logic states of said clock enable signal is 3, a power down mode when it is 2 and a self-refresh mode when it is 1.

12. A method for automatically setting a status of a dynamic random access memory through the control of a clock enable signal, as set forth in claim 10, wherein said step (d) includes the step of, when the number of successive low logic states of said clock enable signal controlled at said step (b) is 3, enabling a memory status setting signal and controlling values of said command signals to perform said clock suspend mode.

* * * * *